(12) United States Patent
Aoki et al.

(10) Patent No.: US 6,712,284 B2
(45) Date of Patent: Mar. 30, 2004

(54) HIGH FREQUENCY SEMICONDUCTOR DEVICE

(75) Inventors: Yoshio Aoki, Yamanashi (JP); Yutaka Mimino, Yamanashi (JP); Osamu Baba, Yamanashi (JP); Muneharu Gotoh, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/090,614

(22) Filed: Mar. 6, 2002

(65) Prior Publication Data

US 2002/0139993 A1 Oct. 3, 2002

(30) Foreign Application Priority Data

Mar. 30, 2001 (JP) ......................................... 2001-099962

(51) Int. Cl.[7] .............................................. H01L 31/072
(52) U.S. Cl. ........................ 237/183; 257/259; 257/728; 257/725; 257/664; 363/846
(58) Field of Search ................... 257/259, 183, 257/728, 664, 725, 752, 753, 275, 296, 276, 738, 701; 343/846; 438/167, 186; 333/247, 260, 129; 361/386, 313, 762, 795

(56) References Cited

U.S. PATENT DOCUMENTS

| | | | | |
|---|---|---|---|---|
| 4,739,448 A | * | 4/1988 | Rowe et al. | 361/386 |
| 5,273,943 A | * | 12/1993 | Kameyama et al. | 501/135 |
| 5,303,419 A | * | 4/1994 | Ittipiboon et al. | 455/327 |
| 5,384,486 A | * | 1/1995 | Konno | 257/752 |
| 5,396,397 A | * | 3/1995 | McClanahan et al. | 361/313 |
| 5,668,509 A | * | 9/1997 | Hoffmeister et al. | 333/33 |
| 6,002,593 A | * | 12/1999 | Tohya et al. | 361/765 |
| 6,043,556 A | * | 3/2000 | Tomie | 257/664 |
| 6,057,600 A | * | 5/2000 | Kitazawa et al. | 257/728 |
| 6,362,525 B1 | * | 3/2002 | Rahim | 257/738 |
| 6,365,961 B1 | * | 4/2002 | Tomie | 257/664 |
| 6,411,181 B1 | * | 6/2002 | Ishikawa et al. | 333/219 |
| 6,483,714 B1 | * | 11/2002 | Kabumoto et al. | 361/760 |

* cited by examiner

Primary Examiner—Nathan J. Flynn
Assistant Examiner—Fazli Erdem
(74) Attorney, Agent, or Firm—Westerman, Hattori, Daniels & Adrian, LLP

(57) ABSTRACT

In a high frequency semiconductor device, a shield plate which is connected to the ground potential is provided above an MMIC structure including line conductors, with an insulating interlayer provided therebetween. By using the shield plate to shield the MMIC, interference caused by external electromagnetic waves or leakage of electromagnetic waves to the exterior can be reduced in a chip alone.

20 Claims, 13 Drawing Sheets

HIGH FREQUENCY SEMICONDUCTOR DEVICE

BACKGROUND OF THE INVENTION

1. Field of the Invention

The present invention relates to a type of monolithic microwave integrated circuit (MMIC) in which a waveguide for high frequency signals is used.

2. Description of the Related Art

For an MMIC which uses high speed semiconductor elements such as high-electron-mobility transistors (HEMTs) and hetero-bipolar transistors (HBTs), it is necessary to use a high frequency waveguide as a wiring line differently from an ordinary silicon integrated circuit because the MMIC processes high frequency signals. A microstrip line which has stable line characteristics and weak dispersion characteristics which means that frequency dependency of a transmission constant is weak, is used as the high frequency waveguide.

Among MMICs in which microstrip lines according to the related art are used, particularly so-called a "three-dimensional multilayered MMIC" in which a line conductor is multilayered is shown in FIG. 1.

As shown in FIG. 1, the multilayered MMIC has a ground plate 3 provided on a surface insulating layer 2 formed on a semiconductor substrate 1. The ground plate 3 combines with line conductors 5 provided on insulating interlayers 4 to form microstrip lines. A pad 6 is provided on the top insulating interlayer 4 and is connected to the exterior.

The MMIC in FIG. 1 is accommodated in a predetermined package and is wire-bonded to the pad 6 so that its potential is connected to the exterior.

The MMIC processes a high frequency signal, and electromagnetic waves outside the chip of the MMIC may affect the operation of the MMIC. Accordingly, in general, the chip is accommodated in a package the inside of which is electrically shielded.

A metal package or a ceramic package which is known as a package in which the chip is accommodated in electrically shielded condition is expensive. Also, when a plurality of elements are accommodated in a single package, mutual interference caused by electromagnetic waves emitted from the elements must be prevented.

SUMMARY OF THE INVENTION

It is an object of the present invention to provide an MMIC which reduces interference caused by external electromagnetic waves or leakage of electromagnetic waves to the exterior.

To this end, according to the present invention, the above object is achieved through provision of a high frequency semiconductor device including a semiconductor substrate, a ground plate connected to the ground potential, at least one insulating interlayer, a line conductor provided above the ground plate, with the at least one insulating interlayer provided therebetween, at least one terminal for connecting to the exterior, and a shield plate which is provided above the highest layer of the line conductor, with the at least one insulating interlayer provided therebetween and which is connected to the ground potential.

Preferably, the at least one terminal is a wire-bonding pad. The shield plate may have an opening in an area in which the wire-bonding pad is positioned.

The wire-bonding pad may be provided on the shield plate.

The shield plate may substantially cover the entirety of the semiconductor substrate.

The high frequency semiconductor device may further include a plurality of throughholes which are formed in the periphery of the shield plate so as to surround an inner area excluding the periphery and which reach the ground plate, and internal conductors provided in the throughholes, the internal conductors connecting the shield plate and the ground plate.

The at least one terminal may lead from the back of the semiconductor substrate.

The at least one terminal may be connected to the surface of the semiconductor substrate by a viahole penetrating the semiconductor substrate.

The at least one terminal may be a flip chip pad.

The semiconductor substrate may be divided into an element-arranged area in which semiconductor elements are formed and an outer area around the element-arranged area in which at least one terminal is provided, and the shield plate may selectively cover the element-arranged area.

The high frequency semiconductor device may further include a plurality of throughholes which are formed in the periphery of the shield plate so as to surround an inner area excluding the periphery and which reach the ground plate, and internal conductors provided in the throughholes, the internal conductors connecting the shield plate and the ground plate. The at least one terminal and the element-arranged area may be made in conduction by an area in which the throughholes are not provided.

The terminal may be an antenna.

The shield plate may have an opening in a portion corresponding to the antenna.

A terminal for electrically connecting to the exterior may be further provided on the back of the semiconductor substrate.

The terminal may be connected to the surface of the semiconductor substrate by a viahole penetrating the semiconductor substrate.

The terminal may be a flip chip bonding.

The ground plate may be used as an antenna grand plane in the antenna.

The antenna may be provided on the shield plate, and the shield plate may be used as an antenna grand plane.

The antenna may be a patch antenna.

The at least one insulating interlayer may be made of one of polyimide and benzocyclobutene.

According to the present invention, interference caused by external electromagnetic waves or leakage of electromagnetic waves can be reduced in a chip alone because the surface of an MMIC is shielded by a shield plate. Accordingly, simplified packaging can be performed, and a chip according to the present invention can be mounted on a circuit board, or the like.

DESCRIPTION OF THE PREFERRED EMBODIMENTS

Figure 1:
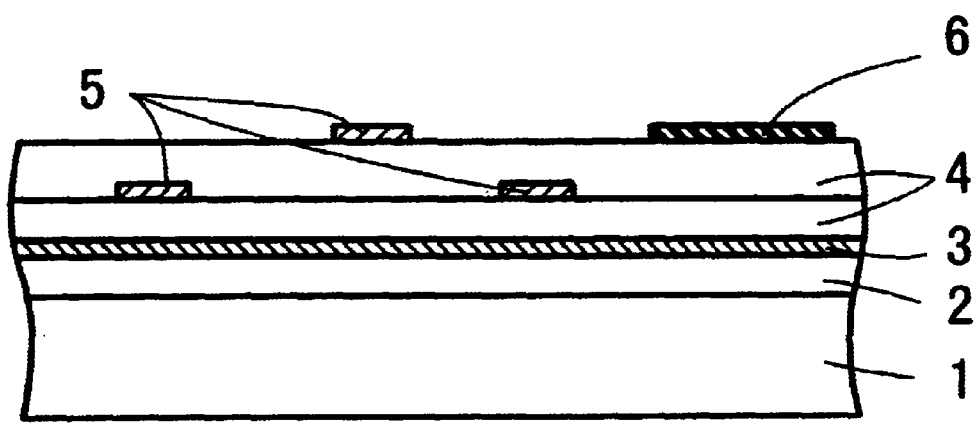
FIG. 1 is a cross-sectional view showing a three-dimensional MMIC according to the related art in which a microstrip line is used.
Figure 2:
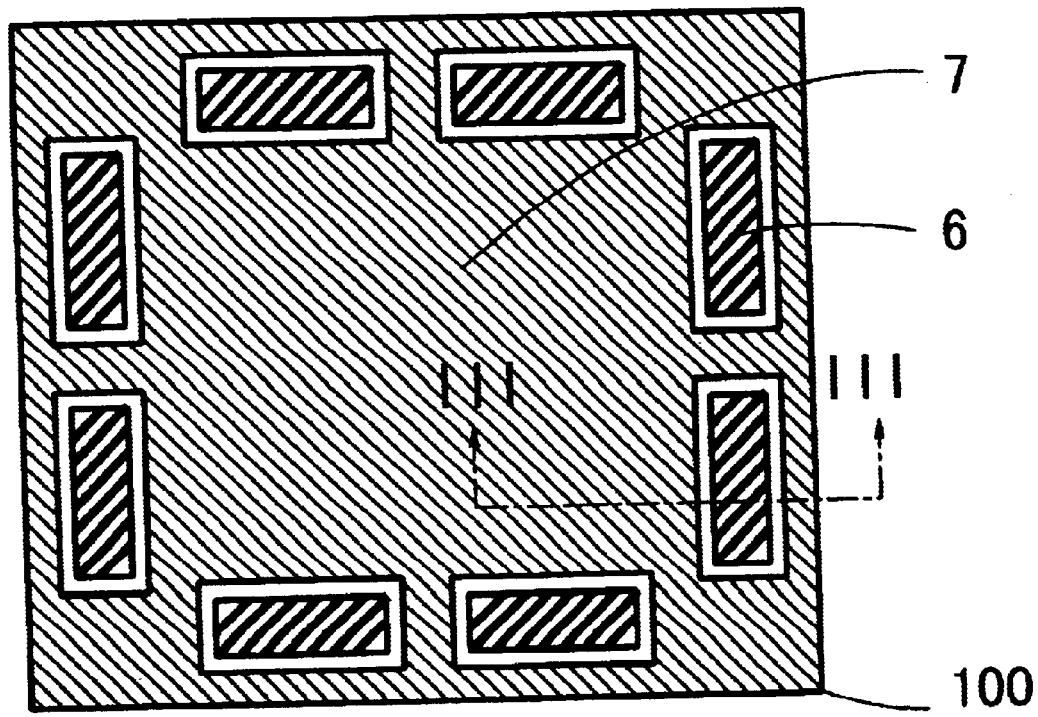
FIG. 2 is a plan view showing the principle of the present invention.
Figure 3:
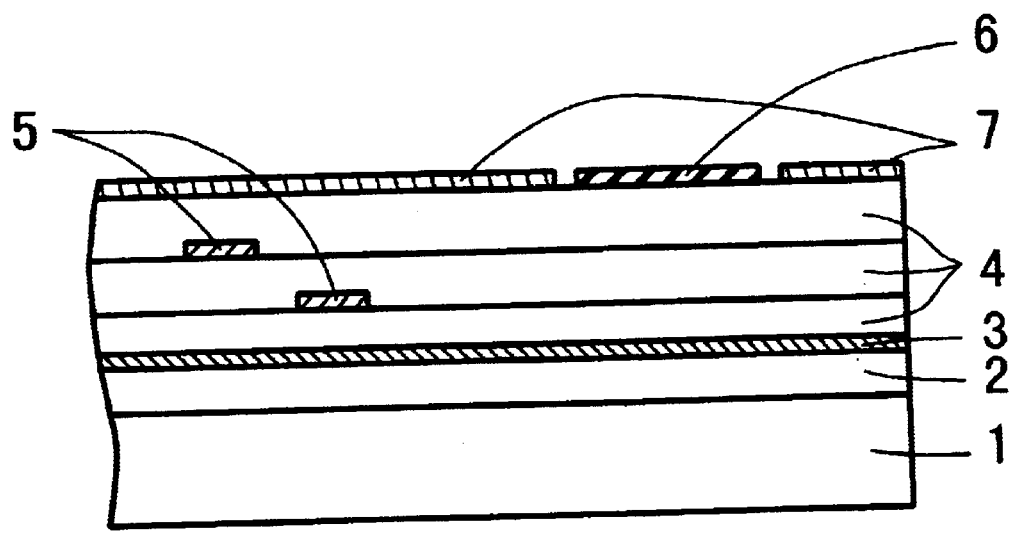
FIG. 3 is a cross-sectional view taken along the line III—III of FIG. 2.

FIG. 2 is a plan view illustrating the principle of the present invention. FIG. 3 shows a cross-section taken along the line III—III of FIG. 2.

In the present invention, a shield plate 7 which is connected to the ground potential is provided above an MMIC structure including line conductors 5, with an insulating interlayer 4 provided therebetween, as shown in FIGS. 2 and 3.

A region in which circuit elements (not shown) are formed on a semiconductor substrate 1, that is, an element-arranged region and the line conductors 5 are shielded on their upper side by the shield plate 7. Thus, interference caused by external electromagnetic waves or leakage of electromagnetic waves to the exterior can be reduced.

Embodiments of the present invention are described below.

Figure 4:
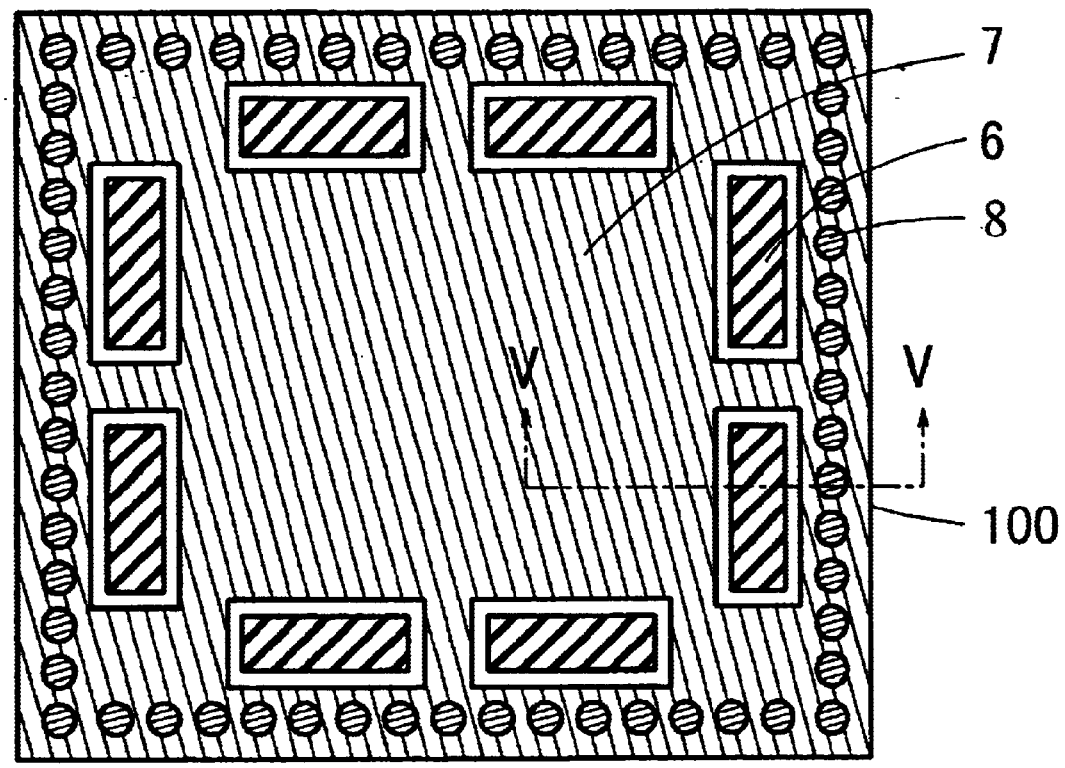
FIG. 4 is a plan view showing an MMIC according to a first embodiment of the present invention.
Figure 5:
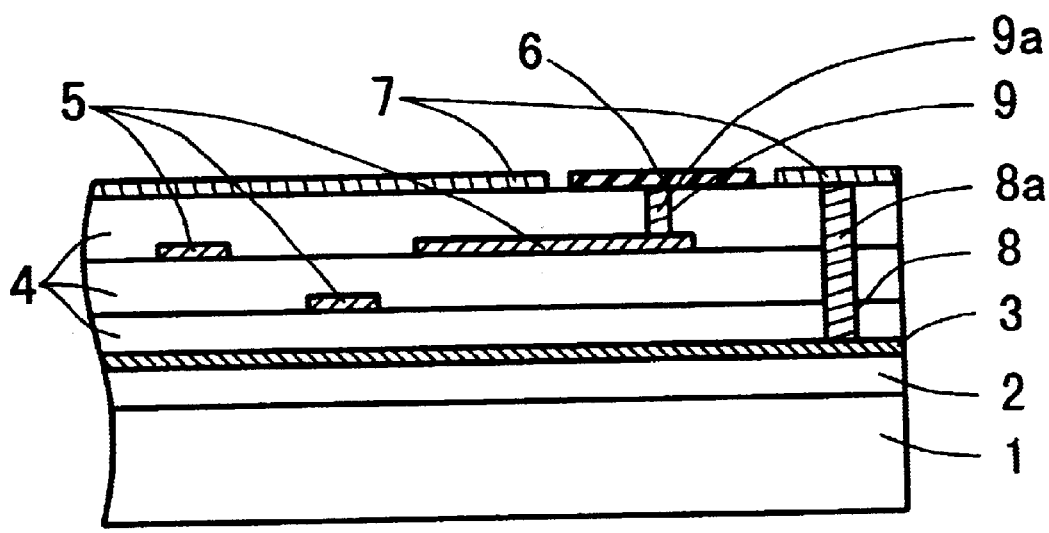
FIG. 5 is a cross-sectional view taken along the line V—V of FIG. 4.

An MMIC according to a first embodiment of the present invention is described with reference to FIGS. 4 and 5. FIG. 4 is partially perspective plan view of the MMIC according to the first embodiment. FIG. 5 shows a cross-section taken along the line V—V of FIG. 4.

In the first embodiment, an active element (not shown) such as a field effect transistor is formed on a semiconductor substrate 1 made of a compound such as gallium arsenide (GaAs), and a surface insulating layer 2 made of silicon nitride is formed on the semiconductor substrate 1. A ground plate 3 which is made of gold (Au) and which is connected to the ground potential by wiring or a throughhole (not shown) is provided on the surface insulating layer 2. Each line conductor 5 is provided above the ground plate 3, with each insulating interlayer 4 provided therebetween. The line conductors 5 combine with the ground plate 3 to form high frequency transmission lines.

Each insulating interlayer 4 is made of polyimide or benzocyclobutene (BCB). Each line conductor 5 is made of gold (Au) and is formed by sputtering or deposition. The line conductor 5 is patterned by using ion milling or lift-off.

In the first embodiment, an insulating interlayer 4 is formed on the line conductor 5 at the highest level, and a shield plate 7 is provided on the insulating interlayer 4. Throughholes 8 which are connected to the ground plate 3 are formed in the shield plate 7 so as to surround the periphery of a chip 100. The shield plate 7 is electrically connected in common to the ground plate 3 by internal conductors 8a provided in the throughholes 8.

Pads 6 are provided as external connection terminals in an outer area around the element-arranged region. The shield plate 7 has openings for exposing the pads 6. The pads 6 are provided so as to be internally retracted by internal conductors 9a in throughholes 9.

According to the first embodiment, the shield plate 7 covers the chip 100, so that electromagnetic wave interference between the chip 100 and the exterior is prevented. In addition, the throughholes 8 in which the internal conductors 8a are provided are formed in the periphery of the chip 100, whereby electromagnetic wave interference on the sides of the chip 100 can be also prevented.

Figure 6:
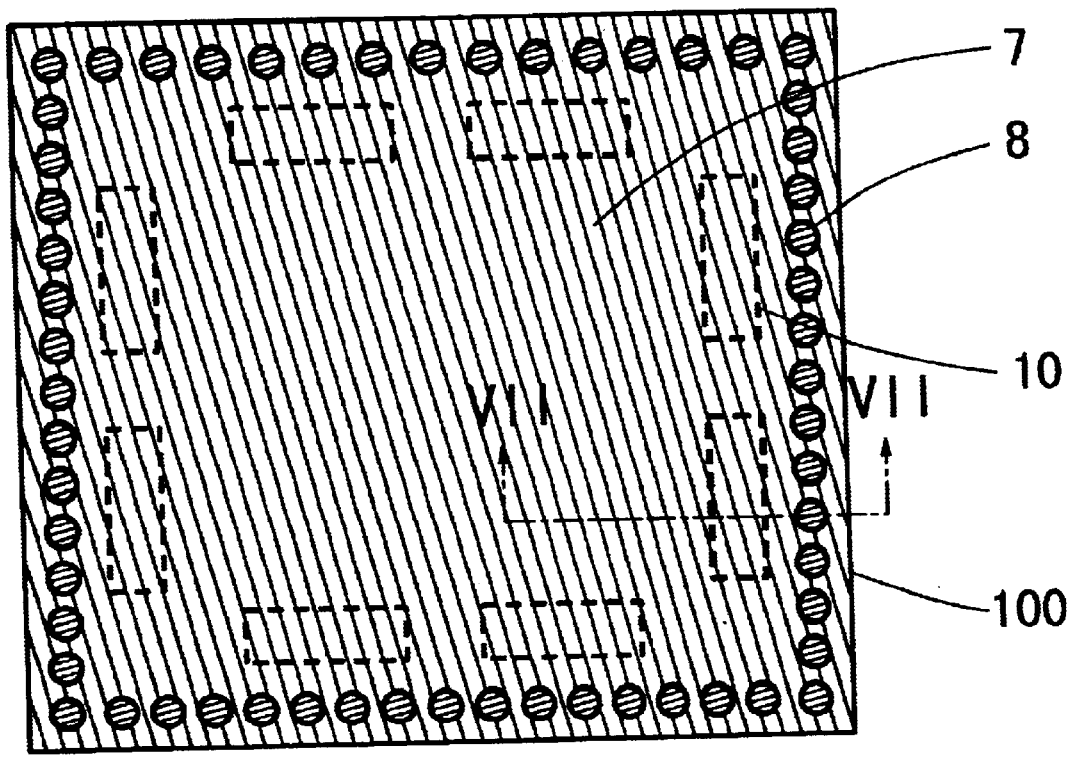
FIG. 6 is a plan view showing an MMIC according to a second embodiment of the present invention.
Figure 7:
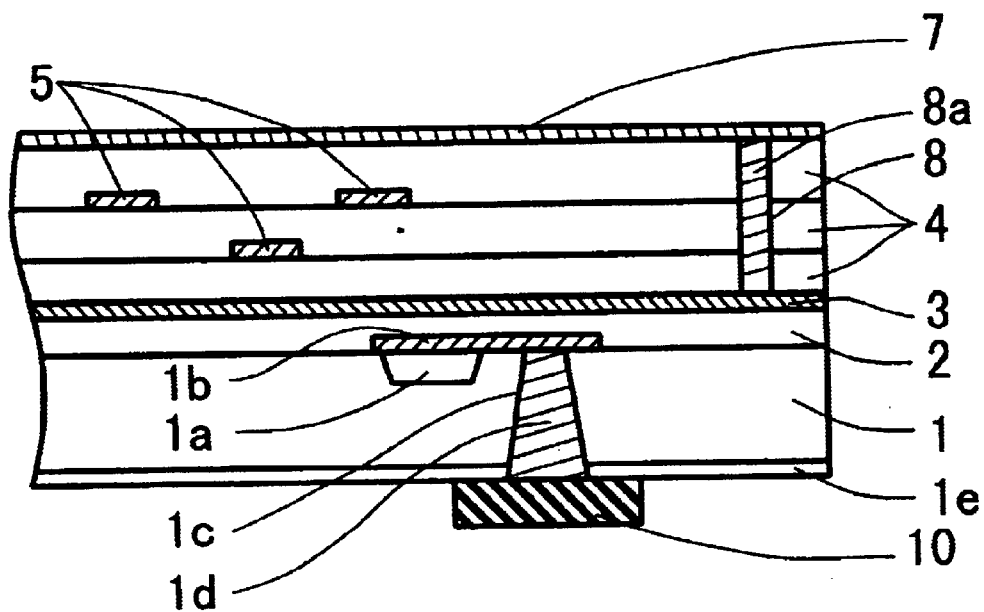
FIG. 7 is a cross-sectional view taken along the line VII—VII of FIG. 6.

An MMIC according to a second embodiment of the present invention is described below with reference to FIGS. 6 and 7. FIG. 6 is a partially perspective plan view of the MMIC according to the second embodiment. FIG. 7 shows a cross-section taken along the line VII—VII of FIG. 6.

In FIGS. 6 and 7, portions identical to those in the first embodiment in FIGS. 4 and 5 are denoted by identical reference numerals.

The second embodiment employs a structure in which flip chip electrodes 10 as external connection pads lead from the back of a semiconductor substrate 1.

For example, when the potential of each active region 1a formed on the semiconductor substrate 1 is connected to each flip chip electrode 10, each surface wiring layer 1b made of gold (Au) from which the potential outwardly leads is formed outside the active region 1a, and each viahole 1c is formed from the back of the semiconductor substrate 1 by etching. An insulating layer 1e is formed on the back of the semiconductor substrate 1. The viahole 1c is filled with an internal conductor 1d, and the internal conductor 1d connects the potential of the surface wiring layer 1b to the flip chip electrode 10. The internal conductor 1d and the flip chip electrode 10 are formed by plating.

When the potential of each line conductor 5 provided on each insulating interlayer 4 is connected to the back surface, the potential of the line conductor 5 may lead similarly by using a throughhole formed in the ground plate 3 and an internal conductor provided in a viahole.

According to the second embodiment, the shield plate 7 does not need to have openings for arranging pads. Thus, a high shielding effect on the surface of the chip 100 which is directly exposed to electromagnetic waves is enhanced.

An MMIC according to a third embodiment of the present invention is described below with reference to FIGS. 8 to 10.

Figure 8:
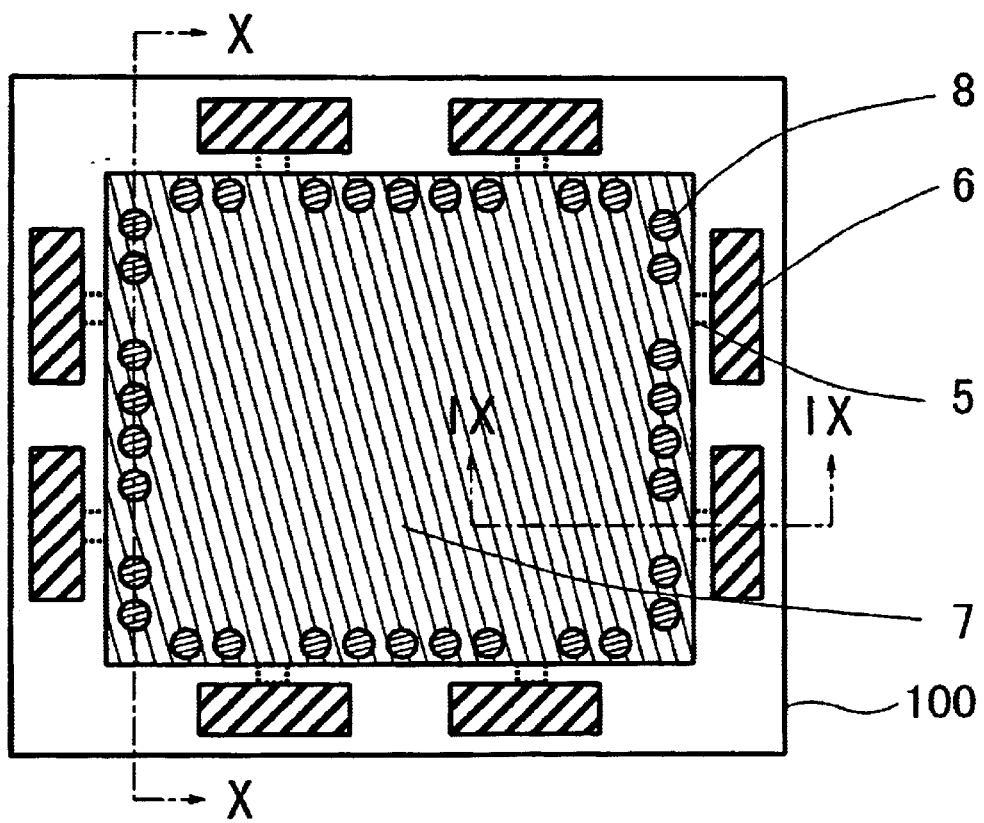
FIG. 8 is a partially perspective plan view showing an MMIC according to a third embodiment of the present invention.

FIG. 8 is a partially perspective plan view of the MMIC according to the third embodiment. FIG. 9 shows a cross-section taken along the line IX—IX of FIG. 8. FIG. 10 shows a cross-section taken along the line X—X of FIG. 8.

Figure 9:
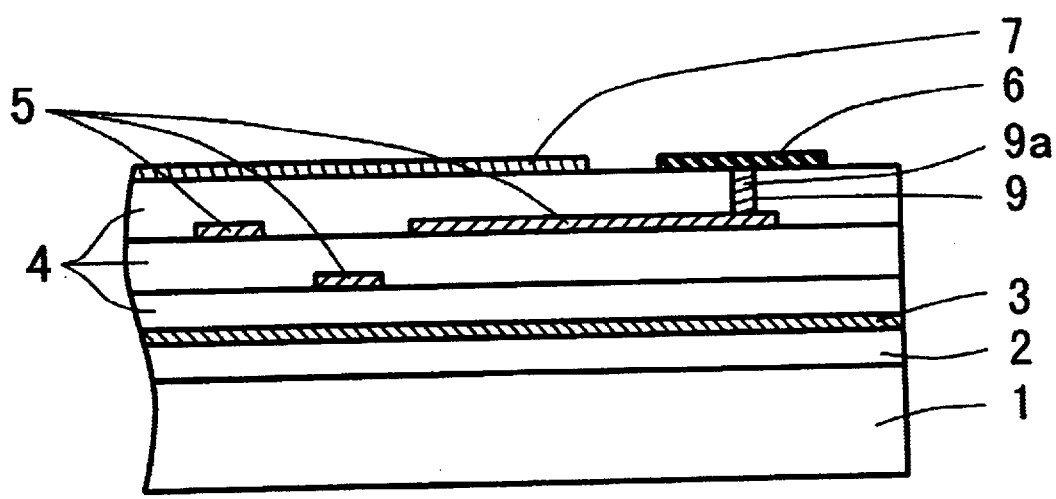
FIG. 9 is a cross-sectional view taken along the line IX—IX of FIG. 8.
Figure 10:
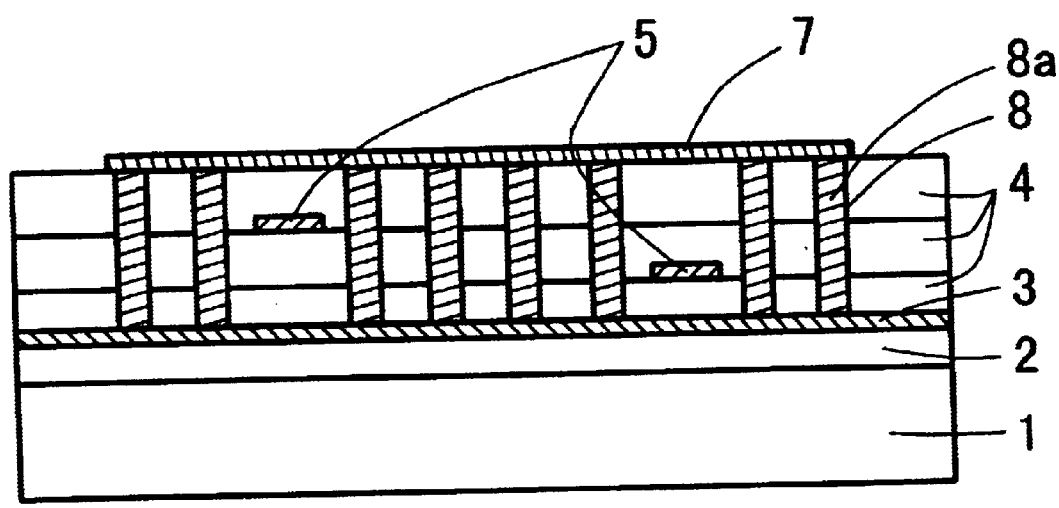
FIG. 10 is a cross-sectional view taken along the line X—X of FIG. 9.

In FIGS. 8 to 10, portions identical to those in the first and second embodiments are denoted by identical reference numerals.

In a structure employed in the third embodiment, a shield plate 7 is provided only above an element-arranged area on a semiconductor substrate 1 provided with semiconductor elements, without being provided above an outer area around the element-arranged area in which pads 6 are provided. Similarly to the first and second embodiments, throughholes 8 are formed in the periphery of the shield plate 7, and internal conductors 8a provided in the throughholes 8 suppress electromagnetic wave interference on the sides of a chip 100.

As shown in FIGS. 9 and 10, the pads 6 are connected to the line conductors 5 in an outside area of the shield plate 7, extending through area having no throughhole.

Figure 11:
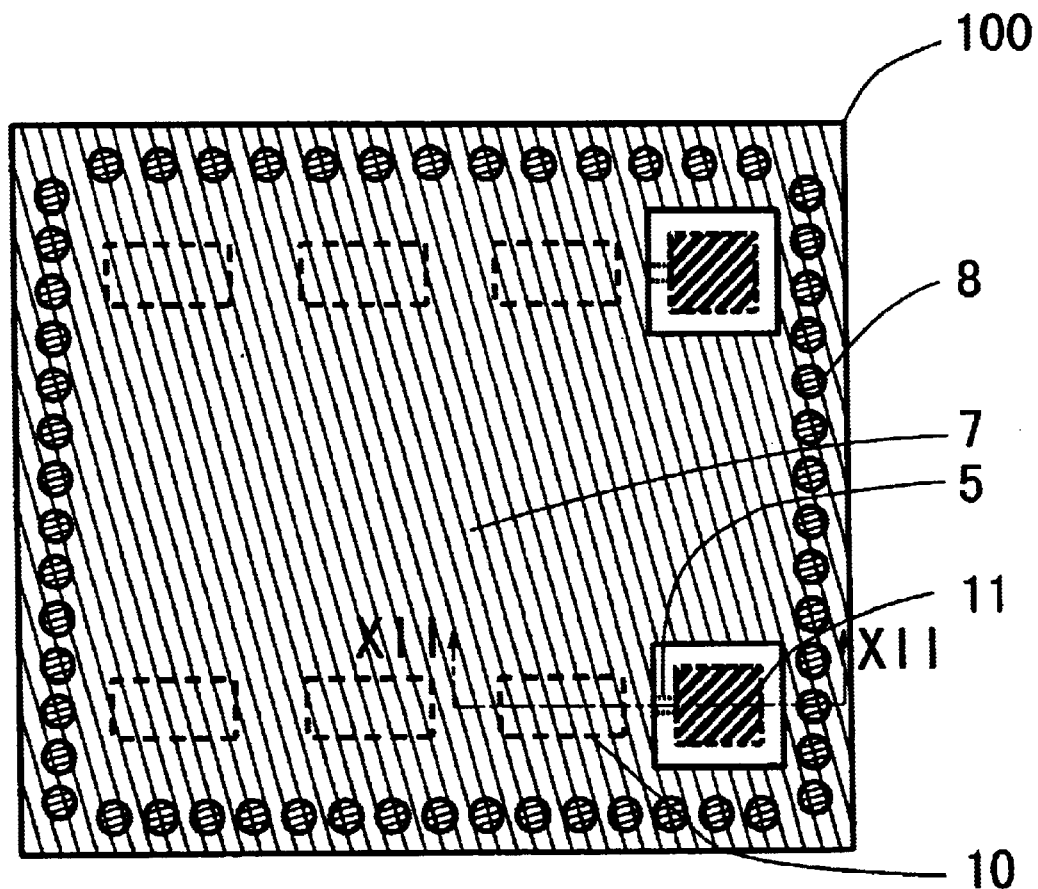
FIG. 11 is a partially perspective plan view showing an MMIC according to a fourth embodiment of the present invention.
Figure 12:
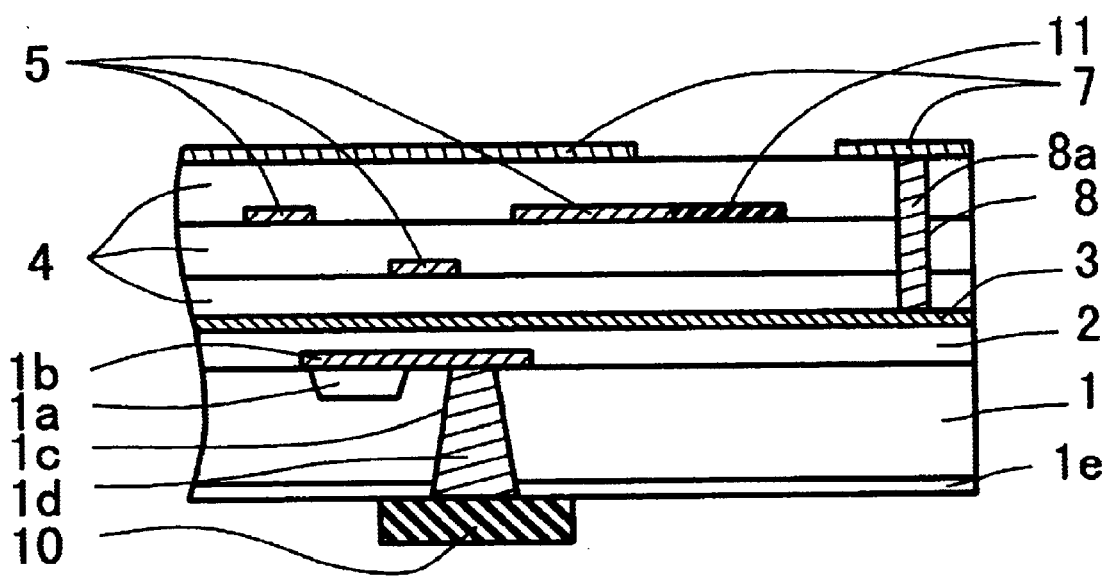
FIG. 12 is cross-sectional view taken along the line XII—XII of FIG. 11.

An MMIC according to a fourth embodiment of the present invention is described below with reference to FIGS. 11 and 12. FIG. 11 is a partially perspective plan view of the MMIC according to the fourth embodiment. FIG. 12 shows a cross-section taken along the line XII—XII of FIG. 11.

In FIGS. 11 and 12, portions identical to those in the first to third embodiments are denoted by identical reference numerals.

In the fourth embodiment, antennas 11 are used to transmit/receive signals to/from the exterior. The antennas 11 are provided in two portions for transmission and reception. Each antenna 11 has a patch antenna structure in which a ground plate 3 is used as an antenna grand plane. The antenna 11 is connected to the internal circuit of the MMIC by line conductors 5.

For inputting/outputting signals without using the antenna 11 and for connecting to a power supply or the ground potential, flip chip electrodes 10 are provided on the back of a semiconductor substrate 1. A structure identical to that in the second embodiment is employed regarding to each flip chip electrode 10.

Figure 13:
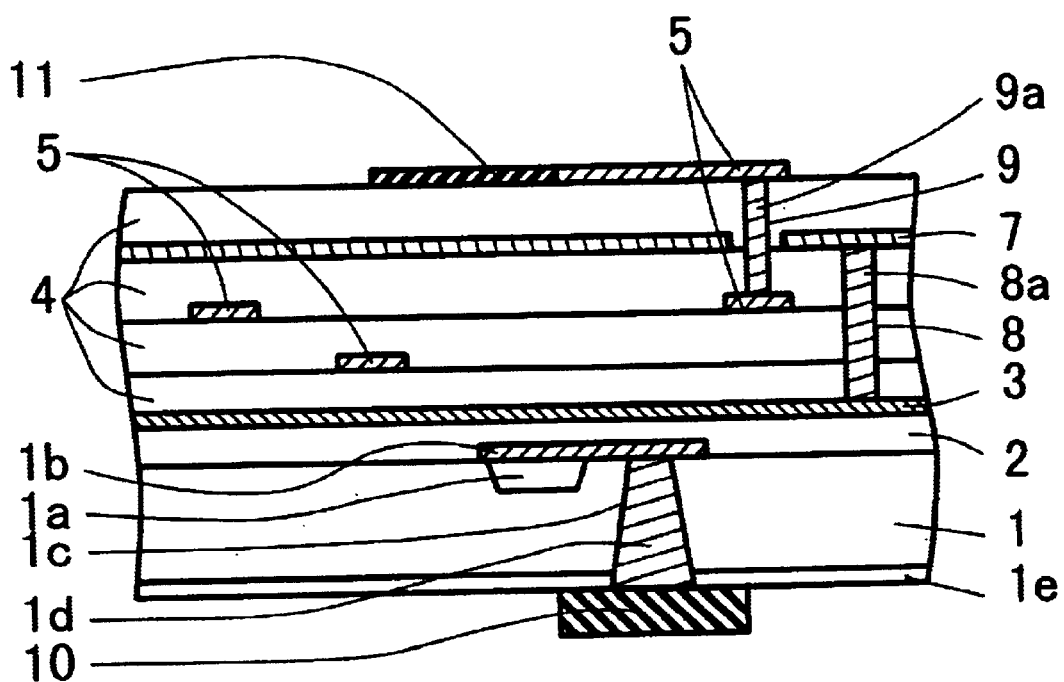
FIG. 13 is a cross-sectional view showing an MMIC according to a fifth embodiment of the present invention.

An MMIC according to a fifth embodiment of the present invention is described below with reference to FIG. 13. FIG. 13 is a cross-sectional view of the MMIC.

In FIG. 13, portions identical to those in FIG. 12 are denoted by identical reference numerals.

Although in the fourth embodiment, the ground plate 3 functions as an antenna grand plane, a shield plate 7 can be used as an,antenna grand plane, as shown in FIG. 13. In the fourth embodiment, circuit elements such as the line conductors 5 cannot be arranged in an area under the antenna 11 because the ground plate 3 is used as an antenna grand plane. However, in the fifth embodiment, by using the shield plate 7 as an antenna grand plane, the antennas 11 can be separated from the line conductors 5, etc., in high frequency ranges by the shield plate 7, and the antennas 11 be disposed in arbitrary positions.

In the fifth embodiment, the thickness and dielectric constant of an insulating interlayer 4 between the antenna 11 and the shield plate 7 are optimized so that the antenna 11 can have predetermined characteristics. However, the antenna 11 may be replaced by a pad for electrically connecting to the exterior, without considering the optimization.

What is claimed is:

1. A high frequency semiconductor device comprising:
   a semiconductor substrate;
   at least one active element formed on said semiconductor substrate;
   a ground plate connected to a ground potential, said ground plate being provided on said semiconductor substrate;
   at least one insulating interlayer;
   a plurality of line conductors provided on said ground plate, with said at least one insulating interlayer provided therebetween; the plurality of line conductors individually acting as a microstrip line combining with said around plate;
   at least one terminal for connecting to the exterior; and
   a shield plate provided on a highest layer of the plurality of line conductors, with said at least one insulating interlayer provided therebetween, said shield plate being connected to the ground potential and substantially covering the entirety of said semiconductor substrate except for an area of said at least one terminal.

2. A high frequency semiconductor device according to claim 1, wherein said at least one terminal is a wire-bonding pad.

3. A high frequency semiconductor device according to claim 2, wherein said shield plate has an opening in an area in which said wire-bonding pad is positioned.

4. A high frequency semiconductor device according to claim 1, further comprising:
   a plurality of throughholes formed in the periphery of said a shield plate so as to surround an inner area excluding the periphery, the throughholes reaching said a ground plate; and
   internal conductors provided in the throughholes, said internal conductors connecting said a shield plate and said a ground plate.

5. A high frequency semiconductor device according to claim 1, wherein said at least one terminal is connected to the first major surface of said semiconductor substrate by a viahole penetrating said semiconductor substrate.

6. A high frequency semiconductor device according to claim 1, wherein:
   said semiconductor substrate is divided into an element-arranged area in which semiconductor elements are formed and an outer area around said element-arranged area in which at least one terminal is provided; and
   said shield plate selectively covers said element-arranged area.

7. A high frequency semiconductor device according to claim 6, wherein further comprising:
   a plurality of throughholes formed in the periphery of said shield plate so as to surround an inner area excluding the periphery, the throughholes reaching said ground plate; and
   internal conductors provided in the throughholes, said internal conductors connecting said shield plate and said ground plate;
   wherein said at least one terminal and said element-arranged area are made in conduction by an area in which the throughholes are not provided.

8. A high frequency semiconductor device according to claim 1, wherein said terminal is an antenna.

9. A high frequency semiconductor device according to claim 8, wherein said shield plate has an opening in a portion corresponding to said antenna.

10. A high frequency semiconductor device according to claim 8, wherein a terminal for electrically connecting to the exterior is further provided on the back of said semiconductor substrate.

11. A high frequency semiconductor device according to claim 10, wherein said terminal is connected to the surface of said semiconductor substrate by a viahole penetrating said semiconductor substrate.

12. A high frequency semiconductor device according to claim 10, wherein said terminal is a flip chip bonding electrode.

13. A high frequency semiconductor device according to claim 8, wherein said ground plate is used as an antenna grand plane in said antenna.

14. A high frequency semiconductor device according to claim 8, wherein said antenna is provided on said shield plate, and said shield plate is used as an antenna grand plane.

15. A high frequency semiconductor device according to claim 8, wherein said antenna is a patch antenna.

16. A high frequency semiconductor device according to claim 1, wherein said at least one insulating interlayer is made of one of polyimide and benzocyclobutene.

17. A high frequency semiconductor device comprising:
a semiconductor substrate;
a ground plate connected to a ground potential;
at least one insulating interlayer;
a plurality of line conductors provided on said ground plate, with said at least one insulating interlayer provided therebetween;
at least one terminal for connecting to the exterior; and
a shield plate provided on a highest layer of the plurality of line conductors, with said at least one insulating interlayer provided therebetween, said shield plate being connected to the ground potential;
wherein said terminal is a patch antenna.

18. A high frequency semiconductor device comprising:
a semiconductor substrate;
a ground plate connected to a ground potential;
at least one insulating interlayer;
a plurality of line conductors provided above said ground plate, with said at least one insulating interlayer provided therebetween;
at least one terminal for connecting to the exterior; and
a shield plate provided on a highest layer of the plurality of line conductors, with said at least one insulating interlayer provided therebetween, said shield plate being connected to the ground potential;
wherein said at least one insulating interlayer is made of one of polyimide and benzocyclobutene.

19. A high frequency semiconductor device comprising:
a semiconductor substrate having first and second major surfaces;
at least one active element formed on said first major surface of said semiconductor substrate:
a ground plate connected to a ground potential, said ground plate being provided on said first major surface;
at least one insulating interlayer;
a plurality of line conductors provided on said ground plate, with said at least one insulating interlayer provided therebetween, the plurality of line conductors individually acting as a microstrip line combining with said ground plate;
at least one terminal for connecting to the exterior, and
a shield plate provided on a highest layer of the plurality of line conductors, with said at least one insulating interlayer provided therebetween, said shield plate being connected to the ground potential and substantially covering the entirety of said semiconductor substrate, wherein said at least one terminal is formed on said second major surface of said semiconductor substrate.

20. A high frequency semiconductor device according to claim 19, wherein said at least one terminal is a flip chip pad.

* * * * *